(12) United States Patent
Nosaka et al.

(10) Patent No.: US 11,196,413 B2
(45) Date of Patent: Dec. 7, 2021

(54) DRIVING CIRCUIT FOR SWITCHING ELEMENT, AND SWITCHING CIRCUIT

(71) Applicant: OMRON Corporation, Kyoto (JP)

(72) Inventors: Noriyuki Nosaka, Nara (JP); Wataru Okada, Kizugawa (JP); Hironori Nakada, Nara (JP); Satoshi Iwai, Hirakata (JP)

(73) Assignee: OMRON CORPORATION, Kyoto (JP)

( * ) Notice: Subject to any disclaimer, the term of this patent is extended or adjusted under 35 U.S.C. 154(b) by 0 days.

(21) Appl. No.: 17/272,731

(22) PCT Filed: Mar. 13, 2019

(86) PCT No.: PCT/JP2019/010314
§ 371 (c)(1),
(2) Date: Mar. 2, 2021

(87) PCT Pub. No.: WO2020/084807
PCT Pub. Date: Apr. 30, 2020

(65) Prior Publication Data
US 2021/0242867 A1 Aug. 5, 2021

(30) Foreign Application Priority Data

Oct. 26, 2018 (JP) .............................. JP2018-201844

(51) Int. Cl.
*H02M 1/08* (2006.01)
*H03K 17/16* (2006.01)
*H03K 17/687* (2006.01)

(52) U.S. Cl.
CPC .............. *H03K 17/16* (2013.01); *H02M 1/08* (2013.01); *H03K 17/687* (2013.01)

(58) Field of Classification Search
CPC ....... H02M 1/08; H03K 17/16; H03K 17/161; H03K 17/687
(Continued)

(56) References Cited

U.S. PATENT DOCUMENTS 4,527,228 A 7/1985 Chi
2011/0080192 A1* 4/2011 Ogawa ............. H03K 17/08122
327/109

FOREIGN PATENT DOCUMENTS

JP  2013099133 A  5/2013
JP  2014093586 A  5/2014
(Continued)

OTHER PUBLICATIONS

International Search Report issued in Intl. Appln. No PCT/JP2019/010314 dated May 21, 2019 English translation provided.
(Continued)

*Primary Examiner* — William Hernandez
(74) *Attorney, Agent, or Firm* — Rossi, Kimms & McDowell LLP (57) ABSTRACT

A switching element 1 has a gate terminal connected to an output end Vout of a driving circuit 12 via a capacitor 11 and a resistor 13 connected in parallel. The switching element 1 has a source terminal connected to the driving circuit 12 via a capacitor 14 and a Zener diode 15 connected in parallel. The Zener diode 15 has an anode terminal connected to the source terminal of the switching element 1 and a cathode terminal connected to the driving circuit 12.

8 Claims, 11 Drawing Sheets

(58) Field of Classification Search
USPC .................................................. 327/108, 109
See application file for complete search history.

(56) References Cited

FOREIGN PATENT DOCUMENTS

| | | |
|---|---|---|
| JP | 2017118717 A | 6/2017 |
| WO | 2017038390 A1 | 3/2017 |

OTHER PUBLICATIONS

Written Opinion issued in Intl. Appln. No. PCT/JP2019/010314 dated May 21, 2019. English translation provided.

* cited by examiner

Fig. 11

DRIVING CIRCUIT FOR SWITCHING ELEMENT, AND SWITCHING CIRCUIT

TECHNICAL FIELD

The present invention relates to a driving circuit for a switching element.

BACKGROUND ART

A technique in which a JFET or the like made from silicon carbide (SiC) is used as a switching element in a power converter or the like has been proposed in the related art. In a driving circuit for such a switching element, in order to prevent malfunctions, a capacitor is provided between a gate and source of the switching element, the capacitor being larger in capacitance than a stray capacitance generated between the drain and the gate. Further, in order to prevent malfunctions, a technique for applying negative bias by using a speed-up capacitor CgD has been proposed (see, for example, Patent Document 1). Similarly, a technique for applying negative bias by using a Zener diode has been proposed (see, for example, Patent Document 2).

A negative bias voltage in the above-described driving circuit for a switching element known in the related art may cause an unwanted phenomenon where a gate surge of the switching element increases.

PRIOR ART DOCUMENTS

Patent Documents

Patent Document 1: Japanese Unexamined Patent Publication No. 2013-99133
Patent Document 2: Japanese Unexamined Patent Publication No. 2014-93586

SUMMARY OF THE INVENTION

Problems to be Solved by the Invention

The present invention has been made in view of the above-described problems, and it is therefore an object of the present invention to provide a technique for allowing, in a driving circuit for a switching element, a reduction in gate surge of the switching element.

Means for Solving the Problem

Provided according to the present invention for solving the above-described problems is a driving circuit for a switching element configured to drive a switching element of a current-driven type, the driving circuit for a switching element including a controller having a first terminal and a second terminal, the controller being configured to output a control signal to a gate terminal of the switching element, a first resistor connected to the first terminal of the controller, the first resistor regulating a current serving as the control signal, a first capacitor connected in parallel to the first resistor, a second capacitor, a first Zener diode connected in parallel to the second capacitor, and a current path extending from the first resistor and the first capacitor to the gate terminal and from a source terminal of the switching element to the second terminal of the controller, the second capacitor and the first Zener diode are put in a path extending from the source terminal to the controller, and the first Zener diode has a cathode terminal connected to the second terminal of the controller and an anode terminal connected to the source terminal.

According to the present invention, input capacitances of the first capacitor, the second capacitor, and the switching element are charged by the current serving as the control signal when the switching element is in the gate-on state, and the electric charge thus stored is discharged via the first resistor and the second resistor when the switching element is in the gate-off state, thereby applying a negative bias voltage to the switching element. The negative bias voltage thus applied does not suddenly increase when the switching element is in a gate-off state, thereby allowing a reduction in gate surge of the switching element.

Further, according to the present invention, when a capacitance of the first capacitor is denoted by C1, a capacitance of the second capacitor is denoted by C2, an input capacitance of the switching element is denoted by Ciss, a source voltage of the control signal is denoted by Vdd, a gate-source voltage when the switching element is in a turn-on state is denoted by Vdev, and a negative bias voltage applied to the switching element is denoted by Vcc, $$\frac{1}{Ciss} * \frac{1}{\left(\frac{1}{C1} + \frac{1}{C2} + \frac{1}{Ciss}\right)} < \frac{Vcc + Vdev}{Vdd} \qquad [\text{Math. 1}]$$

may be satisfied.

This makes it possible to attenuate the negative bias voltage in two steps. This in turn makes it possible to set the negative bias voltage to prevent sudden changes in voltage and current.

Further, according to the present invention, a mirror clamping circuit may be provided in parallel to a path including the switching element, the second capacitor, and the Zener diode.

This makes it possible to prevent a large voltage such as a surge voltage from being applied to the switching element.

Further, according to the present invention, a third capacitor may be connected between the gate terminal and the source terminal of the switching element.

This makes the negative bias voltage variable in a manner that depends on a capacitance value of the third capacitor. This further makes the switching speed of the switching element variable in a manner that depends on the capacitance value of the third capacitor.

Further, according to the present invention, a third resistor connected to the path in series with the first capacitor and in parallel to the first resistor may be provided.

This allows the third resistor to reduce a gate surge of the switching element. This further allows a reduction in switching noise caused in the switching element.

Further, according to the present invention, a second Zener diode may be connected, the second Zener diode having a cathode terminal connected to a section adjacent to the gate terminal of the switching element and an anode terminal connected to a section adjacent to the source terminal of the switching element.

This allows the second Zener diode to reduce a gate surge.

Further, according to the present invention, a fourth resistor may be connected between the gate terminal and the source terminal of the switching element.

This makes the negative bias voltage variable in a manner that depends on a resistance value of the fourth resistor.

Further, according to the present invention, a Schottky diode may be connected in parallel to a path including the switching element, the second capacitor, and the first Zener diode, the Schottky diode having a cathode terminal connected to a section adjacent to the source terminal of the switching element and an anode terminal connected to a section adjacent to the cathode terminal of the first Zener diode.

This allows the Schottky diode to reduce a gate surge.

Further, provided according to the present invention is a switching circuit including a plurality of switching elements of a current-driven type connected in series, and the driving circuit for a switching element configured to drive each of the plurality of switching elements.

According to the present invention, in the switching elements constituting the switching circuit, a gate surge can be reduced. This makes it possible to prevent the switching circuit from malfunctioning and allows a reduction in generation of noise.

Effect of the Invention

According to the present invention, in the driving circuit for a switching element, a gate surge of the switching element can be reduced.

MODE FOR CARRYING OUT THE INVENTION

Application Example

Figure 1:
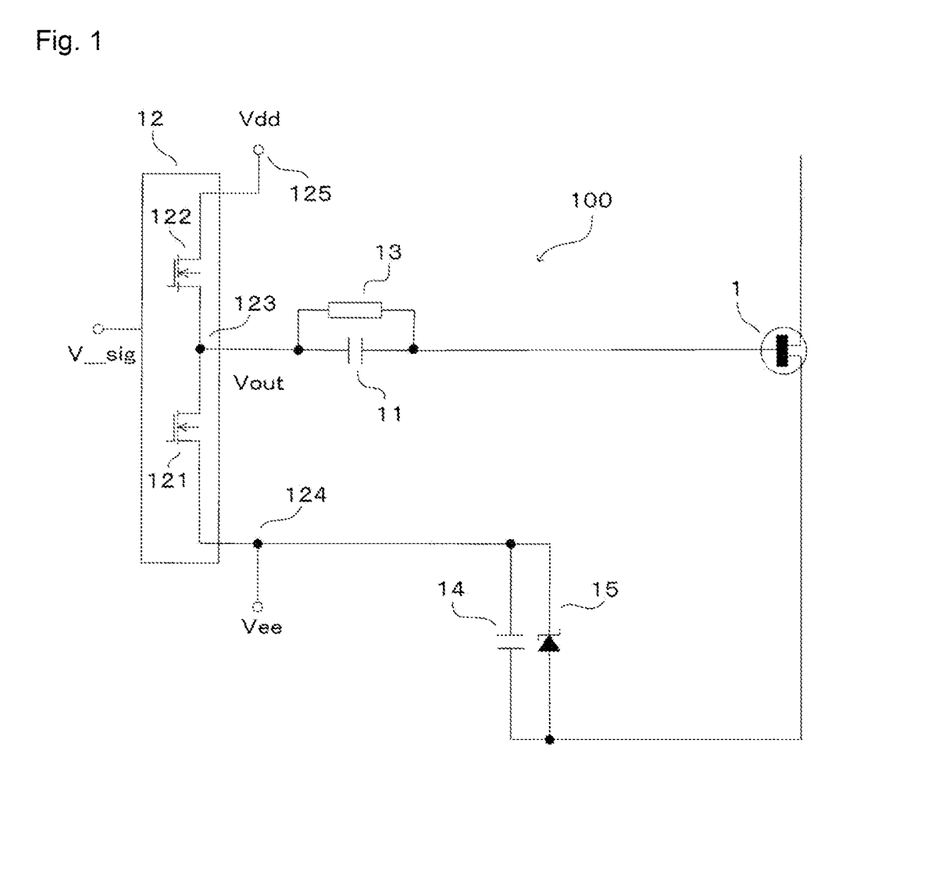
FIG. 1 is a diagram showing a circuit structure of a gate driving circuit 100 according to a first embodiment.

Hereinafter, an application example of the present invention will be described with reference to the drawings. The present invention is applied to, for example, a gate driving circuit 100 for a switching element of a current-driven type as shown in FIG. 1.

In the switching element 1, a negative bias voltage is applied to prevent false turn-on when the switching element is in the gate-off state due to, for example, noise generated from another switching element connected in series with the switching element 1.

Figure 11:
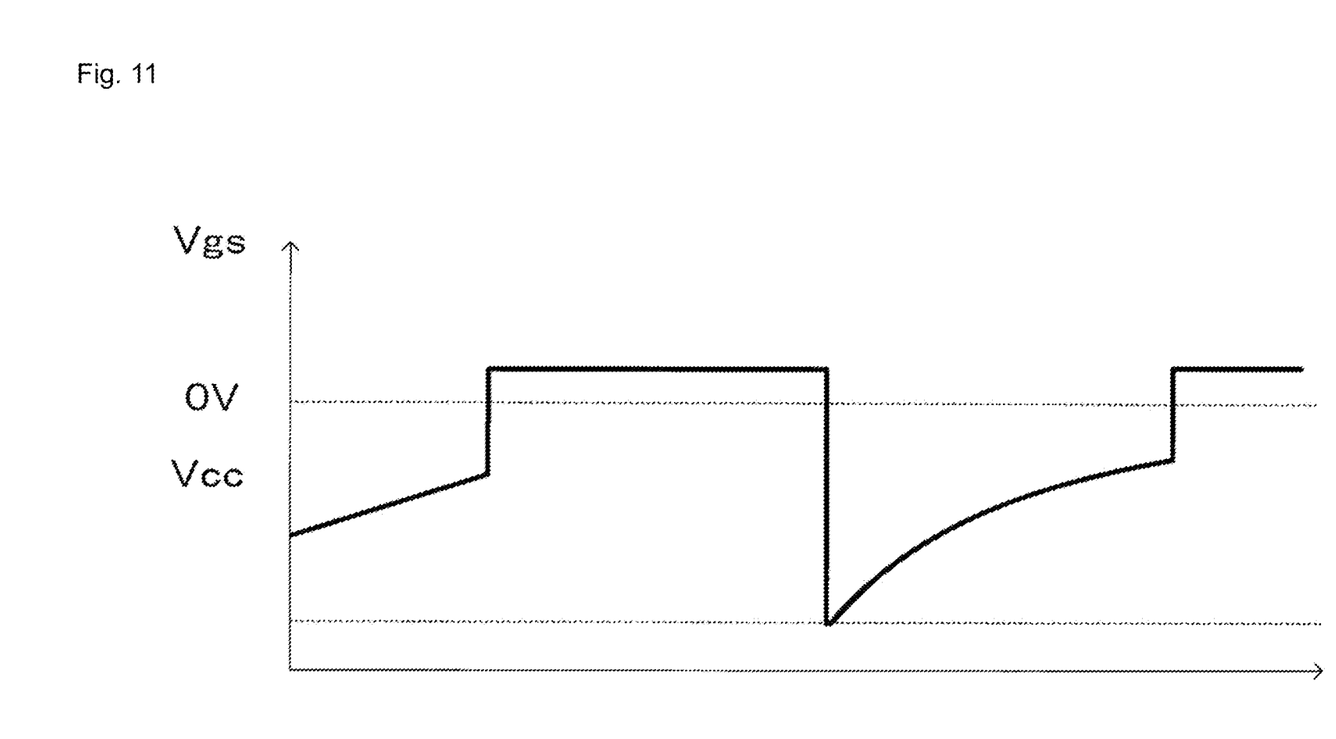
FIG. 11 is a graph showing a profile of a gate voltage applied to a switching element according to an example known in the related art.

As such a negative bias voltage, a voltage having a profile as shown in FIG. 11 is applied across the gate and the source. As shown in FIG. 11, when the switching element is in the gate-off state, the negative bias voltage may suddenly increase to cause a gate surge.

The present invention is therefore intended to reduce a gate surge by suitably changing the negative bias voltage.

Figure 2:
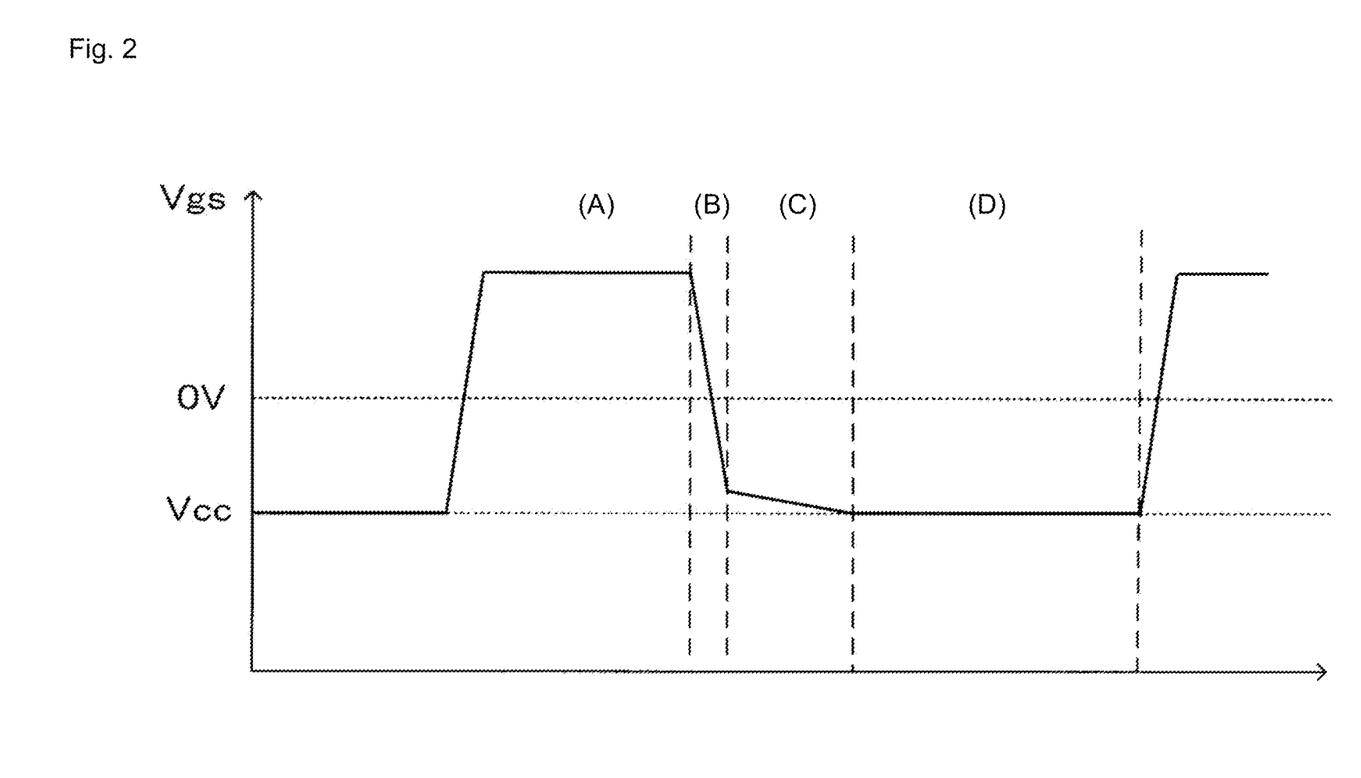
FIG. 2 is a graph showing a profile of a gate voltage applied to a switching element 1 according to the first embodiment.

When the negative bias voltage is applied by the gate driving circuit shown in FIG. 1, a gate-source voltage Vgs applied to the switching element has a profile as shown in FIG. 2. According to the present invention, a first resistor regulating a gate current supplied to the switching element and a first capacitor connected in parallel to the first resistor are provided. The first resistor and the first capacitor are referred to as a limiting resistor and a speed-up capacitor, respectively.

A current serving as a control signal output from a controller for controlling the gate of the switching element flows to a gate terminal of the switching element via the limiting resistor and the speed-up capacitor. Then, this current flows to the controller through a source terminal of the switching element. According to the present invention, a second capacitor and a Zener diode connected in parallel to the second capacitor are put in a current path extending from the source terminal of the switching element to the controller. At this time, the Zener diode has a cathode terminal connected to the controller and an anode terminal connected to the source terminal of the switching element.

The speed-up capacitor connected in series with the path, an input capacitance of the switching element, and the second capacitor are charged by the gate current flowing when the switching element is in the gate-on state, and the electric charge thus stored is discharged via the limiting resistor and the second resistor when the switching element is in the gate-off state. The negative bias voltage having the profile shown in FIG. 2 is applied by the discharge of the electric charge stored in the speed-up capacitor, the input capacitance of the switching element, and the second capacitor, thereby allowing a reduction in gate surge of the switching element.

The present invention is further applicable to a switching circuit including switching elements connected in series and driven by the driving circuit according to the present invention. In such a switching circuit, even when a surge voltage or noise occurs due to, with a switching element in the off state, complementary turn-on of another switching element, suitably changing the negative bias voltage makes it possible to reduce a gate surge of the switching element. This further makes it possible to prevent the switching circuit from malfunctioning. As described above, various effects can be brought about by applying, to the switching circuit, the driving circuit in which a bias is variable. Such a switching circuit only needs to be a circuit having a plurality of switching elements connected in series for switching, and examples of the switching circuit include, but are not limited to, a synchronous rectification boost chopper circuit, a DC/DC converter, an inverter, and the like.

First Embodiment

Hereinafter, a gate driving circuit according to an embodiment of the present invention will be described in more detail with reference to the drawings.

<Device Structure>

FIG. 1 shows the gate driving circuit according to the embodiment.

The switching element 1 has a gate terminal connected to a first end of a capacitor 11 serving as a speed-up capacitor. A resistor 13 serving as a limiting resistor that allows a minute current to flow when the switching element 1 is in the on state is connected in parallel to the capacitor 11. The capacitor 11 has a second end connected to a terminal 123 (hereinafter referred to as "Vout end") from which an output voltage Vout of a driving circuit 12 is output. The switching element 1 has a source terminal connected to a first end of a capacitor 14. The capacitor 14 has a second end connected to a terminal 124 (hereinafter referred to as "Vee end") of the driving circuit 12. A Zener diode 15 is connected in parallel to the capacitor 14. The Zener diode 15 has an anode terminal connected to a section adjacent to the source terminal of the switching element 1 and a cathode terminal connected to the driving circuit 12 via a Vee end. The driving circuit 12 includes two n-channel MOSFETs 121, 122 connected in series between a terminal (hereinafter referred to as "Vdd end") 125 connected to a voltage source Vdd and the Vee end 124. A midpoint between the two MOSFETs 121, 122 is connected to the second end of the capacitor 11 as the Vout end 123. The driving circuit 12 switches the MOSFETs 121, 122 between on and off in accordance with an input signal V_sig. Bringing the MOSFET 121 into the on state and bringing the MOSFET 122 into the off state cause the second end of the capacitor 11 to electrically connect to the Vdd end 125 via the Vout end 123 to allow a gate current to flow to the switching element 1 via the capacitor 11 and the resistor 13. Then, bringing the MOSFET 121 into the off state and bringing the MOSFET 122 into the on state cause the second end of the capacitor 11 to electrically connect to the Vee end 125 and the second end of the capacitor 14 via the Vout end 123 to apply the negative bias voltage across the gate and source of the switching element 1. Here, the capacitor 11 serves as the first capacitor, the resistor 13 serves as the first resistor, the capacitor 14 serves as the second capacitor, the Zener diode 15 serves as a first Zener diode connected in parallel to the second capacitor, the driving circuit 12 serves as the controller, the Vout end 123 serves as a first terminal, and the Vee end 124 serves as a second terminal. Further, a circuit connected from the capacitor 11 and the resistor 13 to the gate terminal of the switching element 1 and from the source terminal of the switching element 1 to the driving circuit 12 corresponds to the path. Further, a current input into the gate terminal of the switching element 1 by switching the MOSFETs 121, 122 of the driving circuit 12 between on and off corresponds to the control signal.

According to the embodiment, an input capacitance of the capacitor 11, an input capacitance of the capacitor 14, and an input capacitance of the switching element 1 are denoted by C1, C2, and Ciss, respectively, a gate source voltage is denoted by Vdd, a device voltage in the on state is denoted by Vdev, a gate voltage is denoted by Vgs, and a negative bias voltage value is denoted by Vcc. At this time, satisfying the following condition makes it possible to attenuate the gate voltage when the switching element is in the gate-off state in two steps.

$$\frac{1}{Ciss} * \frac{1}{\left(\frac{1}{C1} + \frac{1}{C2} + \frac{1}{Ciss}\right)} < \frac{Vcc + Vdev}{Vdd} \qquad \text{[Math. 2]}$$

FIG. 2 shows a profile of the gate voltage applied to the switching element 1 according to the embodiment. (A) of FIG. 2 shows a state where the switching element 1 is in the gate-on state, and (B), (C), and (D) show a state where the switching element 1 is in the gate-off state. As shown in (B) and (C), satisfying the above-described condition attenuates the gate voltage applied to the switching element 1 in two steps.

This allows a reduction in gate surge of the switching element.

According to the embodiment, since the Zener diode 15 is connected in parallel to the capacitor 14, the gate voltage applied to the switching element 1 is regulated by the breakdown voltage (Zener voltage) of the Zener diode 15 and is never lower than Vcc.

Further, in the gate driving circuit 100 according to the embodiment, it is necessary to charge the gate of the switching element 1 via the capacitor 11 when the switching element 1 is in the turn-on state. Therefore, making a design to satisfy the following conditional expression with the amount of electric charge in the gate of the switching element 1 denoted by Qg makes it possible to increase the switching speed when the switching element 1 is in the turn-on state.

$$C1 > Qg(Vdd-Vdev-Vcc) \qquad \text{[Math. 3]}$$

As shown in FIG. 2, increasing the capacitance of the capacitor 11 and making a design to satisfy the above-described conditional expression makes it possible to increase the switching speed of the switching element 1 and cause a waveform of the gate voltage in the gate-on state to rise sharply.

Second Embodiment

Figure 3:
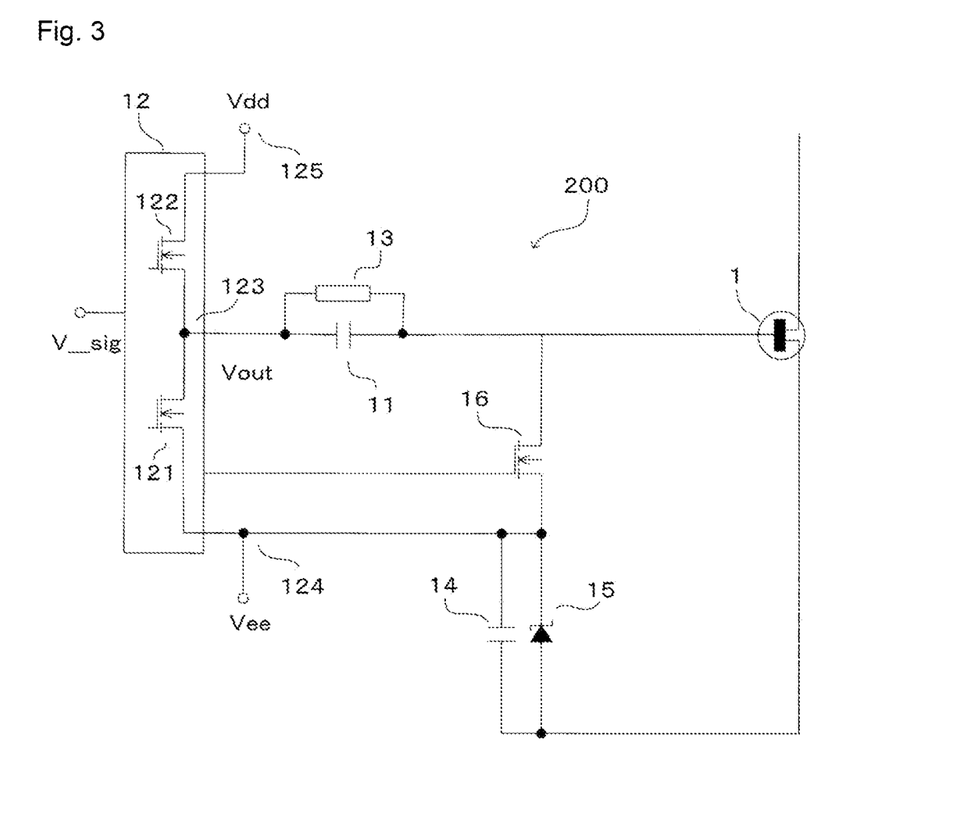
FIG. 3 is a diagram showing a circuit structure of a gate driving circuit 200 according to a second embodiment.

FIG. 3 shows a gate driving circuit 200 according to a second embodiment of the present invention.

The same components as in the first embodiment are denoted by the same reference numerals, and thus no detail description will be given of the components.

According to the embodiment, the switching element 16 is connected in parallel between the gate and source of the switching element 1. The switching element 16 is connected to a section between the gate terminal of the switching element 1 and the first ends of the capacitor 11 and the resistor 13 and to a section between the second end of the capacitor 14 and the cathode terminal of the Zener diode 15. Here, an n-channel MOSFET is used as the switching element 16, and the switching element 16 has a drain terminal connected to a section adjacent to the gate terminal of the switching element 1 and a source terminal connected to a section adjacent to the second end of the capacitor 14 and the cathode terminal of the Zener diode. Further, the switching element 16 has a gate terminal connected to the driving circuit 12 and is controlled in accordance with a signal input from the driving circuit 12.

Figure 4:
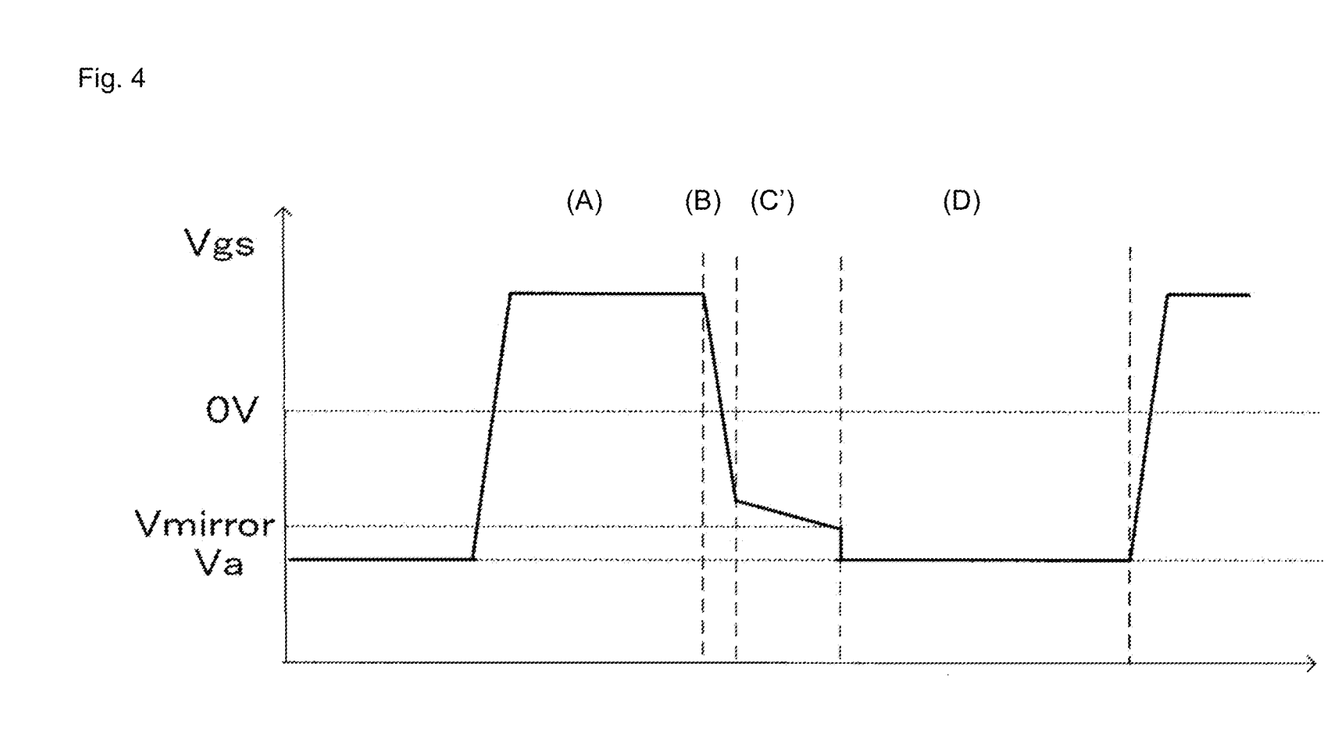
FIG. 4 is a graph showing a profile of a gate voltage applied to the switching element 1 according to the second embodiment.

The switching element 16 serves as a mirror clamping circuit. When the gate voltage Vgs is equal to or less than a Vmirror voltage (for example, Va (minimum negative bias voltage value)+2V), the switching element 16 turns on to set Vgs equal to Va. FIG. 4 shows a profile of the gate voltage Vgs applied to the switching element 1 driven by the gate driving circuit 200 according to the embodiment. In a period denoted by (C') shown in FIG. 4, as described above, when the gate voltage Vgs is equal to or less than Vmirror, the gate voltage Vgs is reduced to Va.

According to the embodiment, when the switching element is provided to cause the gate driving circuit 200 to serve as a gate driving circuit for a synchronous rectification switching element, increasing the negative bias voltage value when a switching element of the opposite arm is in the on state makes it possible to prevent false turn-on and reduce a gate surge. This further allows a reduction in reverse conduction loss during the dead-time period.

Third Embodiment

Figure 5:
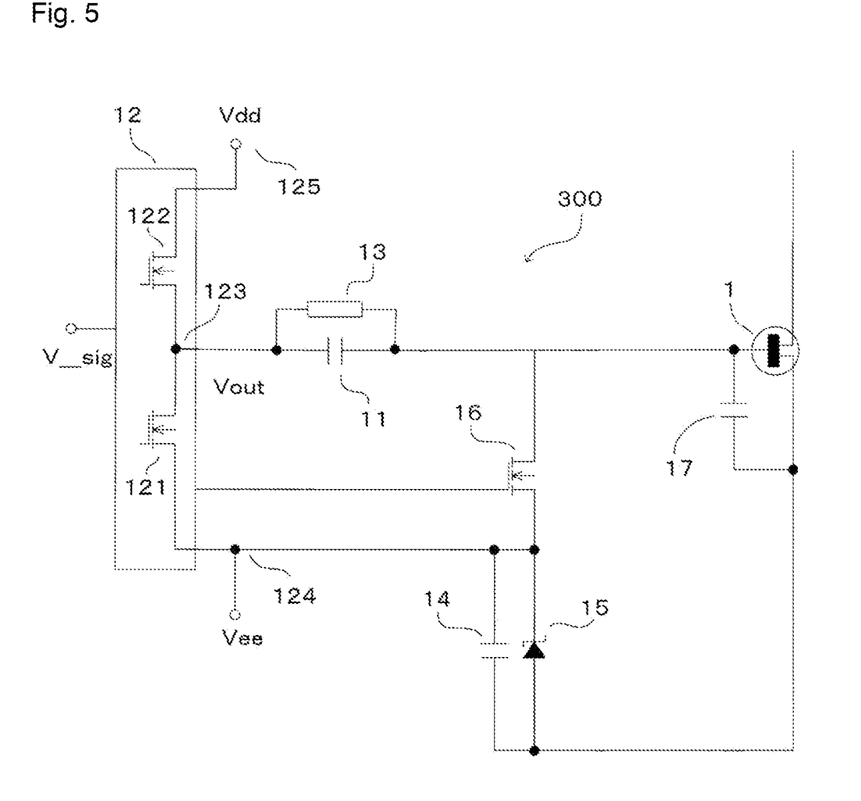
FIG. 5 is a diagram showing a circuit structure of a gate driving circuit 300 according to a third embodiment.

FIG. 5 shows a gate driving circuit 300 according to a third embodiment of the present invention.

The same components as in the second embodiment are denoted by the same reference numerals, and thus no description will be given of the components.

According to the embodiment, a capacitor 17 is connected in parallel between the gate and source of the switching element 1 according to the second embodiment. The capacitor 17 has a first end connected to a section between the gate terminal of the switching element 1 and the drain terminal of the switching element 16 and a second end connected to a section between the source terminal of the switching element 1, and the first end of the capacitor 14 and the anode terminal of the Zener diode 15. Here, the capacitor 17 corresponds to a third capacitor.

According to the embodiment, the addition of the capacitor 17 makes the switching speed variable in a manner that depends on the capacitance value of the capacitor 17.

Fourth Embodiment

Figure 6:
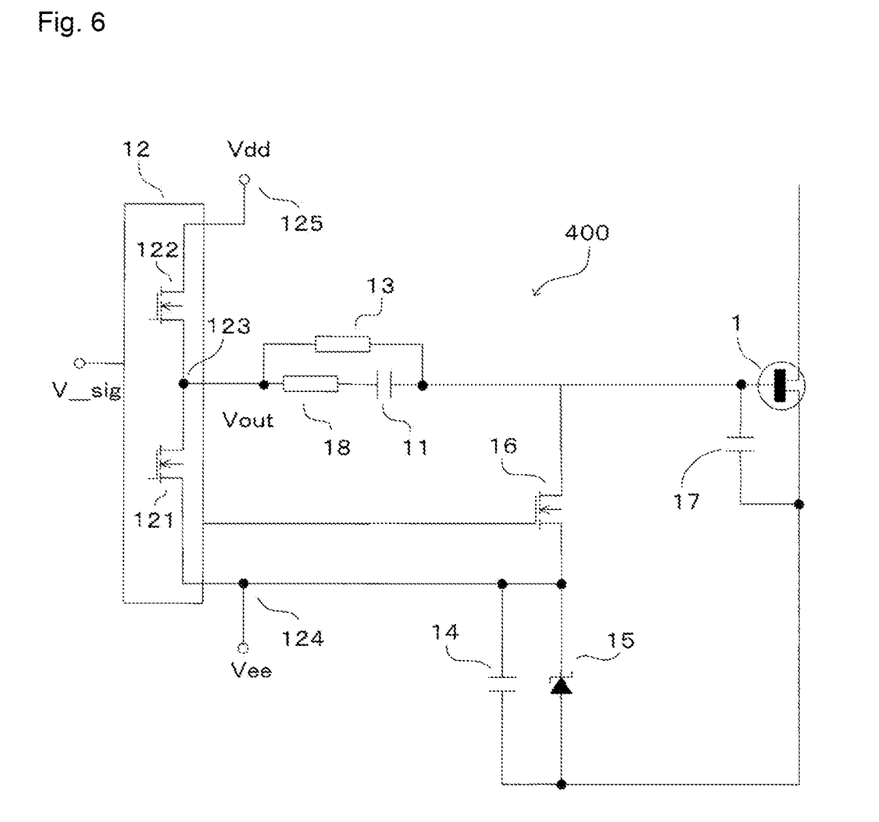
FIG. 6 is a diagram showing a circuit structure of a gate driving circuit 400 according to a fourth embodiment.

FIG. 6 shows a gate driving circuit 400 according to a fourth embodiment of the present invention.

The same components as in the third embodiment are denoted by the same reference numerals, and thus no detail description will be given of the components.

According to the embodiment, a resistor 18 is connected in series with the capacitor 11, and the resistor 13 is connected in parallel to the capacitor 11 and the resistor 18 connected in series. Here, the resistor 13 corresponds to a third resistor.

According to the embodiment, the switching speed of the switching element 1 is variable in a manner that depends on a change in the resistance value of the resistor 18. This allows reductions in gate surge and switching noise.

Fifth Embodiment

Figure 7:
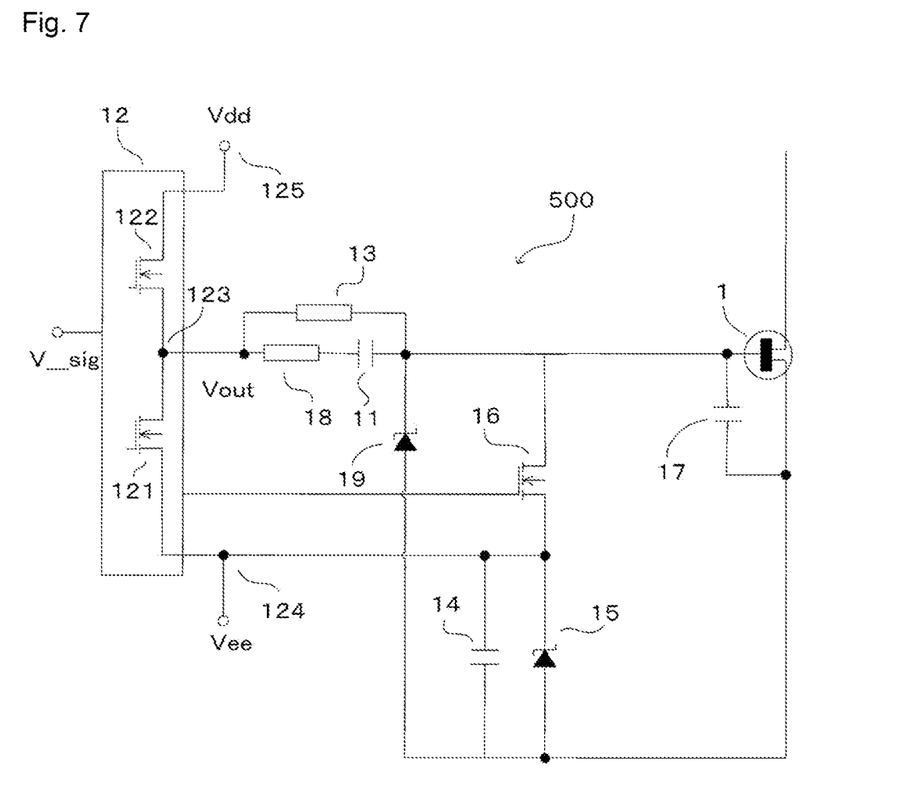
FIG. 7 is a diagram showing a circuit structure of a gate driving circuit 500 according to a fifth embodiment.

FIG. 7 shows a gate driving circuit 500 according to a fifth embodiment of the present invention.

The same components as in the fourth embodiment are denoted by the same reference numerals, and thus no description will be given of the components.

According to the embodiment, a Zener diode 19 is connected in parallel between the gate and source of the switching element 1. The Zener diode 19 has a cathode terminal connected to a circuit that is adjacent to the gate terminal of the switching element 1 and extends from the resistor 13 to the gate terminal of the switching element 1. The Zener diode 19 has an anode terminal connected to a circuit that is adjacent to the source terminal of the switching element 1 and extends from the source terminal to the anode terminal of the Zener diode 15. Here, the Zener diode 19 corresponds to a second Zener diode.

According to the embodiment, the addition of the Zener diode 19 makes it possible to reduce a gate surge.

Sixth Embodiment

Figure 8:
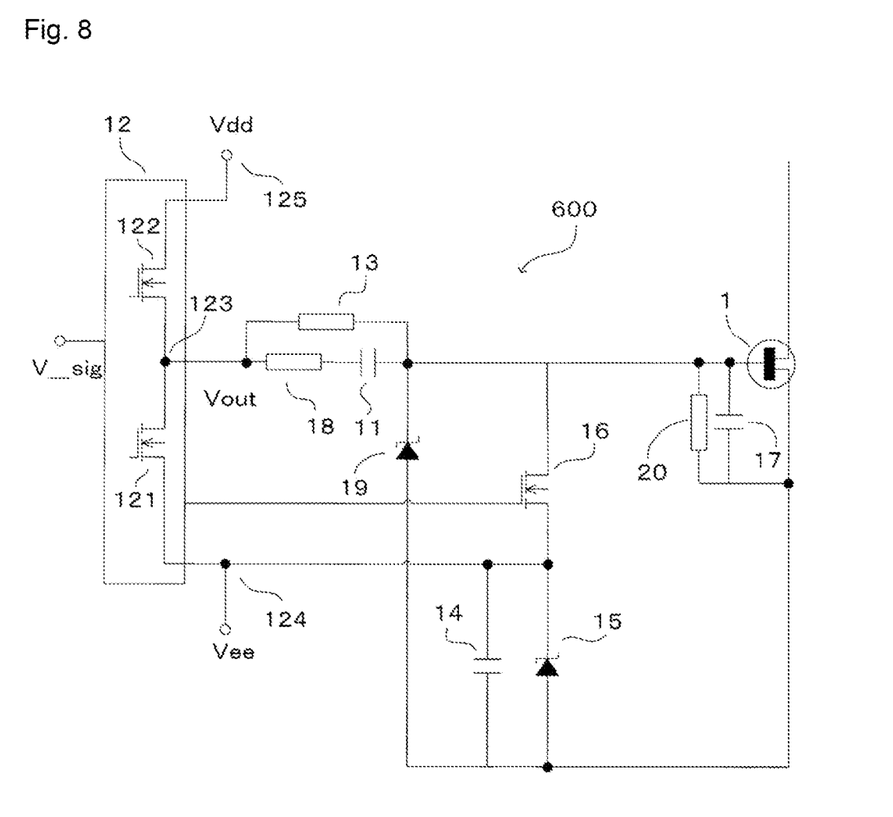
FIG. 8 is a diagram showing a circuit structure of a gate driving circuit 600 according to a sixth embodiment.

FIG. 8 shows a gate driving circuit 600 according to a sixth embodiment of the present invention.

The same components as in the fifth embodiment are denoted by the same reference numerals, and thus no description will be given of the components.

According to the embodiment, a resistor 20 is further connected in parallel to the capacitor 17 connected in parallel between the gate and source of the switching element 1.

According to the embodiment, the addition of the resistor 20 makes it possible to prevent the switching element from malfunctioning due to external noise.

Seventh Embodiment

Figure 9:
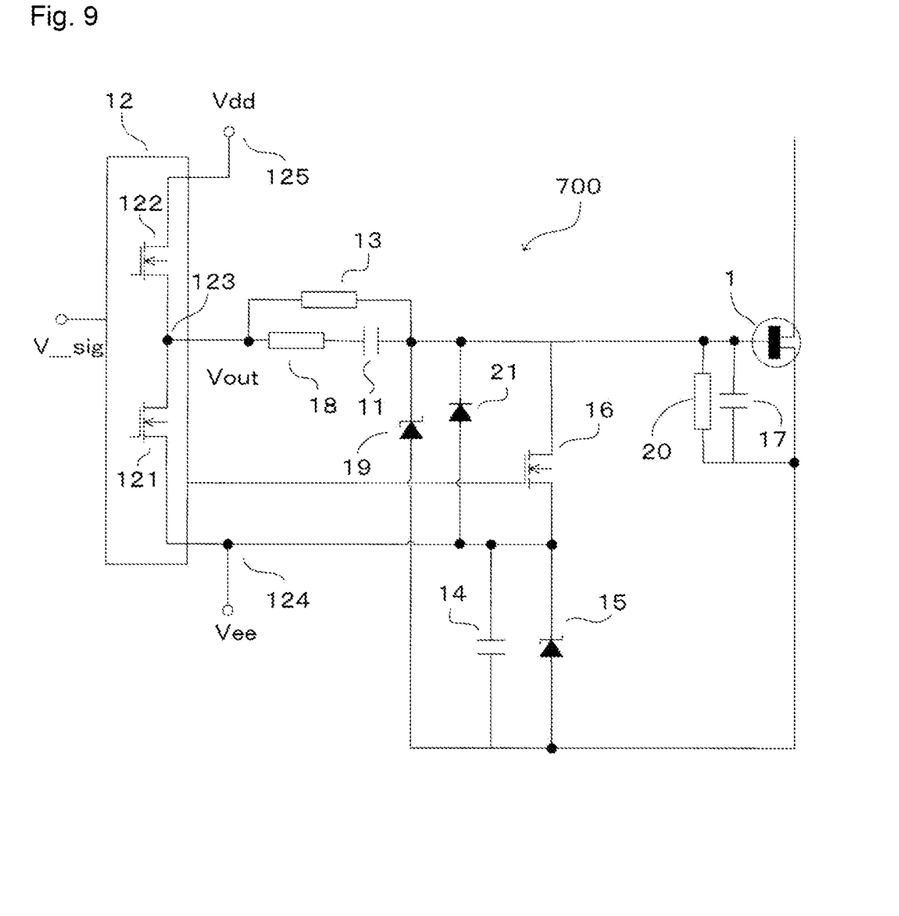
FIG. 9 is a diagram showing a circuit structure of a gate driving circuit 700 according to a seventh embodiment.

FIG. 9 shows a gate driving circuit 700 according to a seventh embodiment of the present invention.

The same components as in the sixth embodiment are denoted by the same reference numerals, and thus no description will be given of the components.

According to the embodiment, a Schottky diode 21 is connected in parallel to the switching element 1, and the Zener diode 15 and the capacitor 14 connected in parallel. The Schottky diode 21 has a cathode terminal connected to a circuit extending from the resistor 13 to the gate terminal of the switching element 1. The Schottky diode 21 has an anode terminal connected to a circuit extending from the cathode terminal of the Zener diode 15 and the capacitor 14 connected in parallel to the Vee end 124 of the driving circuit 12.

According to the embodiment, the addition of the Schottky diode 21 allows a reduction in gate surge.

Eighth Embodiment

Figure 10:
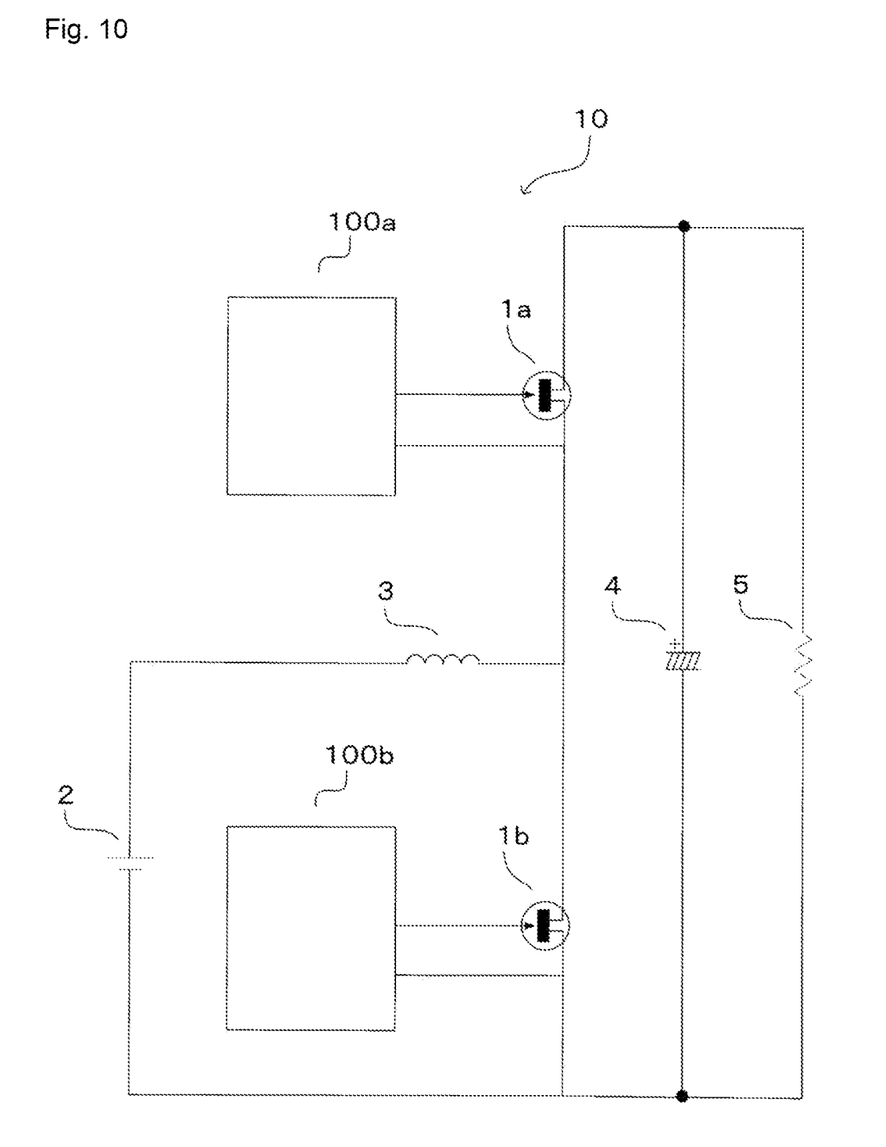
FIG. 10 is a diagram showing a circuit structure of a synchronous rectification boost chopper circuit according to the sixth embodiment.

FIG. 10 shows a synchronous rectification boost chopper circuit 10 according to an eighth embodiment.

The synchronous rectification boost chopper circuit 10 includes switching elements 1a, 1b, gate driving circuits 100a, 100b, an input power supply 2, a reactor 3, a bypass capacitor 4, a load 5, and the like. In the synchronous rectification boost chopper circuit 10, the two switching elements 1a, 1b are connected in series, and the gate driving circuits 100a, 100b are connected to the switching elements 1a, 1b, respectively. The gate driving circuit is not limited to the gate drive device according to the first embodiment, and the gate driving circuit according to another embodiment may be used. Since the function of the synchronous rectification boost chopper circuit 10 is known, no detailed description will be given of the synchronous rectification boost chopper circuit.

This allows, in the switching elements constituting the synchronous rectification boost chopper circuit 10, a reduction in gate surge. This in turn makes it possible to prevent the synchronous rectification boost chopper circuit 10 from malfunctioning and make the synchronous rectification boost chopper circuit 10 high in reliability.

Here, the synchronous rectification boost chopper circuit has been described as an example, but the present invention is applicable to any switching circuit in which a plurality of switching elements driven by one of the gate driving circuits according to the embodiments of the present invention are connected in series, such as a DC/DC converter or an inverter.

Note that, in order to allow a comparison between the configuration requirement of the present invention and the configuration of each of the embodiments, the configuration requirement of the present invention will be described with the reference numerals used in the drawings.

<First Invention>

A driving circuit for a switching element (100, 200, 300, 400, 500) configured to drive a switching element (1) of a current-driven type includes a controller (12) having a first terminal (123) and a second terminal (124), the controller (12) being configured to output a control signal to a gate terminal of the switching element (1), a first resistor (13) connected to the first terminal (123) of the controller (12), the first resistor (13) regulating a current serving as the control signal, a first capacitor (11) connected in parallel to the first resistor (13), a second capacitor (14), a first Zener diode (15) connected in parallel to the second capacitor (14), and a current path extending from the first resistor (13) and the first capacitor (11) to the gate terminal and from a source terminal of the switching element (1) to the second terminal (124) of the controller (12), the second capacitor (14) and the first Zener diode (15) are put in a path extending from the source terminal to the controller (12), and the first Zener diode (15) has a cathode terminal connected to the second terminal (124) of the controller (12) and an anode terminal connected to the source terminal.

<Second Invention>

In the driving circuit for a switching element according to the first invention, when a capacitance of the first capacitor (11) is denoted by C1, a capacitance of the second capacitor (14) is denoted by C2, an input capacitance of the switching element (1) is denoted by Ciss, a source voltage of the control signal is denoted by Vdd, a gate-source voltage when the switching element (1) is in a turn-on state is denoted by Vdev, and a negative bias voltage applied to the switching element is denoted by Vcc, $$\frac{1}{Ciss} * \frac{1}{\left(\frac{1}{C1} + \frac{1}{C2} + \frac{1}{Ciss}\right)} < \frac{Vcc + Vdev}{Vdd} \quad \text{[Math. 4]}$$

is satisfied.

<Third Invention>

The driving circuit for a switching element according to the first or second invention further includes a mirror clamping circuit (16) provided in parallel to a path including the switching element (1), the second capacitor (14), and the first Zener diode (15).

<Fourth Invention>

The driving circuit for a switching element according to the first or second invention further includes a third capacitor (17) connected between the gate terminal and the source terminal of the switching element (1).

<Fifth Invention>

The driving circuit for a switching element according to the first or second invention further includes a third resistor (18) connected to the path in series with the first capacitor (11) and in parallel to the first resistor (13).

<Sixth Invention>

The driving circuit for a switching element according to the first or second invention further includes a second Zener diode (19) having a cathode terminal connected to a section adjacent to the gate terminal of the switching element (1) and an anode terminal connected to a section adjacent to the source terminal of the switching element (1).

<Seventh Invention>

The driving circuit for a switching element according to the first or second invention further includes a fourth resistor (20) connected between the gate terminal and the source terminal of the switching element (1).

<Eighth Invention>

The driving circuit for a switching element according to the first or second invention further includes a Schottky diode (21) connected in parallel to a path including the switching element (1), the second capacitor (14), and the first Zener diode (15), the Schottky diode (21) having a cathode terminal connected to a section adjacent to the source terminal of the switching element (1) and an anode terminal connected to a section adjacent to the cathode terminal of the first Zener diode (15).

<Ninth Invention>

A switching circuit (10) includes a plurality of switching elements (1) of a current-driven type connected in series, and the driving circuit for a switching element (100, 200, 300, 400, 500) according to any one of the first to eighth inventions configured to drive each of the plurality of switching elements (1).

DESCRIPTION OF SYMBOLS 1 switching element
10 synchronous rectification boost chopper circuit
11, 14, 17 capacitor
12 driving circuit
123 Vout end
124 Vee end
13, 18, 20 resistor
15, 19 Zener diode
16 switching element
21 Schottky diode
100, 200, 300, 400, 500 gate driving circuit

The invention claimed is:

1. A driving circuit for a switching element configured to drive a switching element of a current-driven type, the driving circuit for a switching element comprising:
  a controller comprising a first terminal and a second terminal, the controller being configured to output a control signal to a gate terminal of the switching element;
  a first resistor connected to the first terminal of the controller, the first resistor regulating a current serving as the control signal;
  a first capacitor connected in parallel to the first resistor;
  a second capacitor;
  a first Zener diode connected in parallel to the second capacitor; and
  a current path extending from the first resistor and the first capacitor to the gate terminal and from a source terminal of the switching element to the second terminal of the controller, wherein
  the second capacitor and the first Zener diode are put in a path extending from the source terminal to the controller, and the first Zener diode comprises a cathode terminal connected to the second terminal of the controller and an anode terminal connected to the source terminal, and
  when a capacitance of the first capacitor is denoted by C1, a capacitance of the second capacitor is denoted by C2, an input capacitance of the switching element is denoted by Ciss, a source voltage of the control signal is denoted by Vdd, a gate-source voltage when the switching element is in a turn-on state is denoted by Vdev, and a negative bias voltage applied to the switching element is denoted by Vcc, $$\frac{1}{Ciss} * \frac{1}{\left(\frac{1}{C1} + \frac{1}{C2} + \frac{1}{Ciss}\right)} < \frac{Vcc + Vdev}{Vdd} \qquad [\text{Math. 1}]$$

is satisfied.

2. The driving circuit for a switching element according to claim 1, further comprising a mirror clamping circuit provided in parallel to a path comprising the switching element, the second capacitor, and the first Zener diode.

3. The driving circuit for a switching element according to claim 1, further comprising a third capacitor connected between the gate terminal and the source terminal of the switching element.

4. The driving circuit for a switching element according to claim 1, further comprising a third resistor connected to the path in series with the first capacitor and in parallel to the first resistor.

5. The driving circuit for a switching element according to claim 1, further comprising a second Zener diode comprising a cathode terminal connected to a section adjacent to the gate terminal of the switching element and an anode terminal connected to a section adjacent to the source terminal of the switching element.

6. The driving circuit for a switching element according to claim 1, further comprising a fourth resistor connected between the gate terminal and the source terminal of the switching element.

7. The driving circuit for a switching element according to claim 1, further comprising a Schottky diode connected in parallel to a path comprising the switching element, the second capacitor, and the first Zener diode, the Schottky diode comprising a cathode terminal connected to a section adjacent to the source terminal of the switching element and an anode terminal connected to a section adjacent to the cathode terminal of the first Zener diode.

8. A switching circuit comprising:
a plurality of switching elements of a current-driven type connected in series; and
a driving circuit for a switching element configured to drive each of the plurality of switching elements,
the driving circuit for the switching element comprising:
a controller comprising a first terminal and a second terminal, the controller being configured to output a control signal to a gate terminal of the switching element;
a first resistor connected to the first terminal of the controller, the first resistor regulating a current serving as the control signal;
a first capacitor connected in parallel to the first resistor;
a second capacitor;
a first Zener diode connected in parallel to the second capacitor; and
a current path extending from the first resistor and the first capacitor to the gate terminal and from a source terminal of the switching element to the second terminal of the controller, wherein
the second capacitor and the first Zener diode are put in a path extending from the source terminal to the controller, and the first Zener diode comprises a cathode terminal connected to the second terminal of the controller and an anode terminal connected to the source terminal, and
when a capacitance of the first capacitor is denoted by C1, a capacitance of the second capacitor is denoted by C2, an input capacitance of the switching element is denoted by Ciss, a source voltage of the control signal is denoted by Vdd, a gate-source voltage when the switching element is in a turn-on state is denoted by Vdev, and a negative bias voltage applied to the switching element is denoted by Vcc, $$\frac{1}{Ciss} * \frac{1}{\left(\frac{1}{C1} + \frac{1}{C2} + \frac{1}{Ciss}\right)} < \frac{Vcc + Vdev}{Vdd} \qquad [\text{Math. 1}]$$

is satisfied.

* * * * *